(12) United States Patent
Lo

(10) Patent No.: US 7,381,654 B2
(45) Date of Patent: Jun. 3, 2008

(54) METHOD FOR FABRICATING RIGHT-ANGLE HOLES IN A SUBSTRATE

(75) Inventor: Cheng-Yao Lo, Taipei (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 368 days.

(21) Appl. No.: 11/141,791

(22) Filed: May 31, 2005

(65) Prior Publication Data

US 2006/0270068 A1 Nov. 30, 2006

(51) Int. Cl.
*H01L 21/302* (2006.01)
(52) U.S. Cl. .................. 438/736; 438/7; 438/637; 438/638; 438/942; 257/E21.027; 257/E21.035; 257/E21.036; 257/E21.039
(58) Field of Classification Search ............. 438/7, 438/637, 942–951; 257/E21.027–E21.039
See application file for complete search history.

(56) References Cited

U.S. PATENT DOCUMENTS

| | | | |
|---|---|---|---|
| 5,242,770 A | 9/1993 | Chen et al. | |
| 5,891,749 A * | 4/1999 | Park | 438/38 |
| 5,953,609 A * | 9/1999 | Koyama et al. | 438/253 |
| 6,087,046 A | 7/2000 | Nakasuji | |
| 6,121,155 A * | 9/2000 | Yang et al. | 438/725 |
| 6,190,989 B1 * | 2/2001 | Roberts | 438/396 |
| 6,194,104 B1 | 2/2001 | Hsu | |
| 6,204,187 B1 | 3/2001 | Rupp et al. | |
| 6,303,272 B1 | 10/2001 | Furukawa et al. | |
| 6,350,390 B1 * | 2/2002 | Liu et al. | 216/59 |
| 6,420,257 B2 | 7/2002 | Ireland | |
| 6,423,455 B1 | 7/2002 | Tzu | |
| 6,428,936 B1 | 8/2002 | Schenker | |
| 6,444,410 B1 * | 9/2002 | Huang et al. | 430/330 |
| 6,455,439 B2 * | 9/2002 | Sandhu | 438/736 |
| 6,475,921 B2 | 11/2002 | Sandhu | |
| 6,537,708 B2 | 3/2003 | Chan | |
| 6,562,544 B1 * | 5/2003 | Cheung et al. | 430/313 |
| 6,578,190 B2 | 6/2003 | Ferguson et al. | |
| 6,586,142 B1 | 7/2003 | Lin et al. | |
| 6,599,665 B1 | 7/2003 | Lin et al. | |
| 6,664,011 B2 | 12/2003 | Lin et al. | |
| 6,682,858 B2 | 1/2004 | Lin | |
| 6,686,129 B2 | 2/2004 | Chang et al. | |
| 6,835,666 B2 | 12/2004 | Popp | |
| 2001/0002304 A1 | 5/2001 | Pierrat et al. | |
| 2002/0012854 A1 | 1/2002 | Peng | |
| 2003/0039898 A1 | 2/2003 | Aton et al. | |

(Continued)

*Primary Examiner*—Ha Nguyen
*Assistant Examiner*—Daniel Whalen
(74) *Attorney, Agent, or Firm*—Duane Morris LLP (57) ABSTRACT

A method is disclosed for forming right-angle contact/via holes for semiconductor devices. A device is provided on a substrate and covered with a first dielectric layer. A second dielectric layer having an etch rate different from that of the first layer is provided over the first layer. A first photoresist pattern is provided over the second layer to define an X or Y dimension of the contact/via hole. A second photoresist pattern is provided over the second layer to define an opposite dimension of the contact/via hole. First and second pattern dimensions are measured prior to etching to ensure appropriate dimensioning of the etched cavity. A second dry etch is then performed to form the contact/via hole. If the photoresist pattern is not within a desired tolerance, the etching process may be adjusted to ensure the cavity will have the desired dimensions.

18 Claims, 4 Drawing Sheets

U.S. PATENT DOCUMENTS

2003/0044696 A1  3/2003  Liu et al.
2003/0104702 A1  6/2003  Wu
2005/0003284 A1  1/2005  Lu et al.
2005/0136335 A1* 6/2005  Chen et al. .................... 430/5

* cited by examiner

Fig. 7

METHOD FOR FABRICATING RIGHT-ANGLE HOLES IN A SUBSTRATE

FIELD OF THE INVENTION

The present invention relates generally to a method for fabricating contact and via holes in a dielectric material, and more particularly to a method for fabricating contact and via holes having increased geometric stability.

BACKGROUND OF THE INVENTION

Photolithography is a fundamental integrated circuit fabrication technique that transfers a pattern from a photomask (often referred to as a reticle) to a layer of photoresist. The pattern is transferred by exposing the photoresist layer to light through the photomask, and is then developed to form a resist mask.

As integrated circuits reach ever-higher levels of integration, their shrinking internal dimensions, including both the sizes of circuit elements and the spacing between the circuit elements, pose problems for photolithography. One problem is the optical proximity effect (OPE), a general term for various phenomena that distort the mask pattern when it is transferred to the photoresist. For example, right-angled corners may become rounded, lines may become shortened at their ends, and line widths may be altered.

These optical proximity effects can seriously alter the electrical characteristics of integrated circuits. They also affect fabrication yields, by causing unintended metal lines to overlap, for example, leading to short circuits and device failure.

Known methods of compensating for optical proximity effects include the optical proximity corrections disclosed in U.S. Pat. No. 5,723,233 to Garza et al., and U.S. Pat. No. 5,879,844 to Yamamoto et al. These known methods include increasing the contrast of the exposure apparatus, expanding the process window, adding auxiliary patterns or serifs to the main mask pattern, and increasing or reducing the line widths in the main mask pattern.

The known corrective methods, however, fail to provide a simple method adequate to the needs of current high levels of integration. It is the object of the present invention to produce a square contact/via or line-end pattern at the end of the line as it appears on the mask.

SUMMARY OF THE INVENTION

A method of forming a contact or via hole is disclosed, comprising the steps of: (a) providing a substrate; (b) providing a first dielectric layer over the substrate; (c) providing a second dielectric layer over the first dielectric layer; (d) providing a first photoresist pattern over said second dielectric layer, said first photoresist pattern having a first dimension; (e) verifying the first dimension; (f) performing a first etch to remove a portion of the second dielectric layer left unprotected by the first photoresist pattern; (g) providing a second photoresist pattern over said second dielectric layer, said second photoresist having a second dimension in a direction oriented substantially perpendicular to said first dimension; (h) verifying the second dimension; and (i) performing a second etch to remove a portion of the first dielectric layer left unprotected by the second photoresist pattern; wherein the second etch forms a hole in the first dielectric layer, said hole defined by said first and second dimensions of said first and second photoresist patterns.

A method of forming a hole in a semiconductor device is also disclosed, comprising the steps of: (a) providing a substrate; (b) depositing a first dielectric layer over said substrate; (c) depositing a second dielectric layer over said first dielectric layer; (d) providing a first patterned layer of photoresist over said second dielectric layer, said first patterned layer of photoresist defining a first dimension; (e) measuring said first dimension and comparing a measured value of said first dimension with a first reference dimension; (e) performing a first etch step to form a substantially planar first sidewall in said second dielectric layer, and to expose a portion of said first dielectric layer; (f) providing a second patterned layer of photoresist over said second dielectric layer and over said exposed portion of said first dielectric layer, said second patterned layer of photoresist defining a second dimension; (e) measuring said second dimension and comparing a measured value of said first dimension with a second reference dimension; and (g) performing a second etch step to remove a portion of said first dielectric layer left unprotected by said second patterned layer of photoresist; wherein the second etch step forms a hole in the first dielectric layer, said hole being defined by said first and second dimensions of said first and second patterned layer of photoresist.

A method of forming a hole in a semiconductor device is disclosed, comprising the steps of: (a) providing a substrate; (b) providing a first dielectric layer over said substrate; (c) providing a second dielectric layer over said first dielectric layer; (d) providing a first patterned layer of photoresist over said second dielectric layer; (e) measuring a first dimension of said first patterned layer of photoresist and comparing said first dimension to a first reference value; (f) performing a first substantially anisotropic dry etch to form a first sidewall in the second dielectric layer; (g) stripping the first patterned layer of photoresist; (h) providing a second patterned layer of photoresist over the second dielectric layer and over an exposed portion of the first dielectric layer; (i) measuring a second dimension of said second patterned layer of photoresist and comparing said second dimension to a second reference value; and (j) performing a second substantially anisotropic dry etch to remove a portion of the first dielectric layer left unprotected by the second patterned layer of photoresist; wherein said second substantially anisotropic dry etch forms a hole in said first dielectric layer, said hole being defined by said first and second dimensions of said first and second patterned layer of photoresist.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts, and further wherein.

DETAILED DESCRIPTION

According to an embodiment of the present invention, disclosed herein is a method for forming right-angle contact and via holes or line ends for semiconductor devices.

Figure 1:
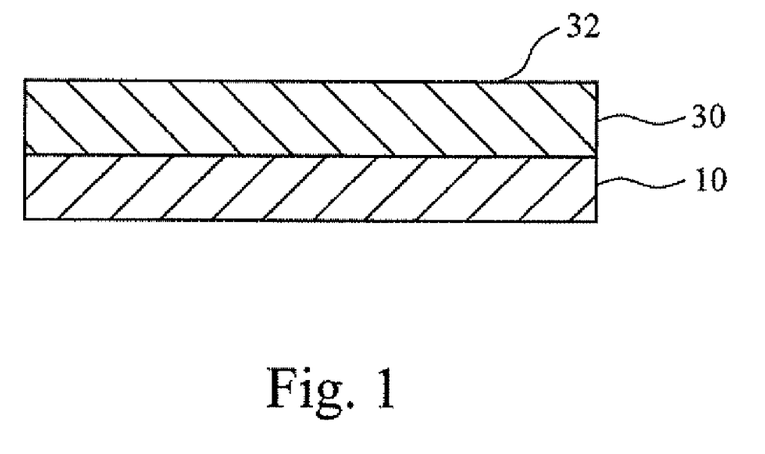
FIG. 1 is a cross section view of a substrate, with a front end device and first dielectric layer disposed thereon.

Referring to FIG. 1, a substrate 10 is provided upon which or within which a front-end device (not shown) is fabricated. The specifics of the front-end device, as will be appreciated, are not critical and so will not be discussed in detail. A first dielectric layer 30 can be formed over the front-end device using known methods, such as chemical vapor deposition (CVD) or the like. The upper surface 32 of the first dielectric layer can then be planarized using, for example, chemical mechanical polishing (CMP) techniques in order to provide a uniform, substantially flat, surface. The first dielectric layer 30 is intended to cover and protect the front-end device, and preferably will be deposited to a thickness suitable to maintain a layer of from about 1000 Angstroms [Å] to about 2000 Å after planarization. Preferred dielectric materials for use as the first dielectric layer 30 can be SiC, SiON, SiN and SiOC.

Figure 2:
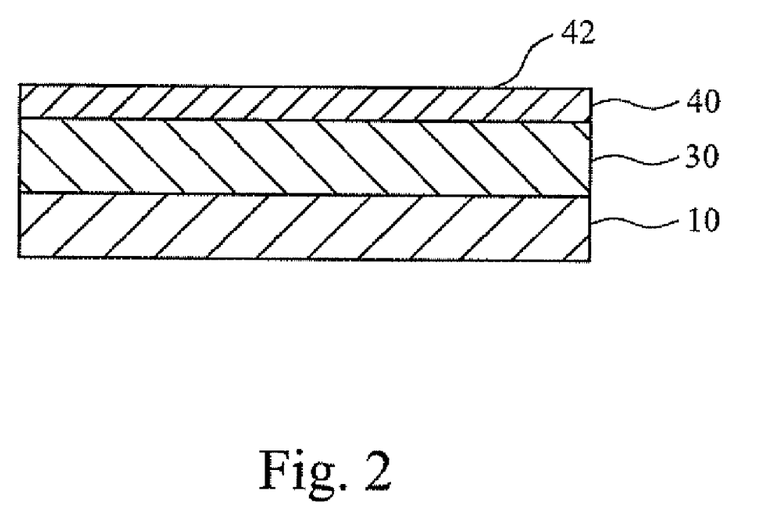
FIG. 2 is a cross section view of the structure of FIG. 1, with a second dielectric layer disposed thereon.

Referring to FIG. 2, a second dielectric layer 40 may be formed over the first dielectric layer 30, again using a method such as CVD. Similar to the first dielectric layer 40, the upper surface 42 of the second dielectric layer 40 may be planarized using CMP or other appropriate technique, again to achieve a substantially uniform, flat, surface. The material selected for the second dielectric layer 40 should have an etch rate that is substantially different from that of the first dielectric layer 30, for reasons that will be explained in detail below. Preferably, the second dielectric layer 40 will be $SiO_2$, and will be deposited to a relatively thinner thickness than the first dielectric layer 30. The thickness of the second layer may be from about 300 Å to about 500 Å.

Figure 3:
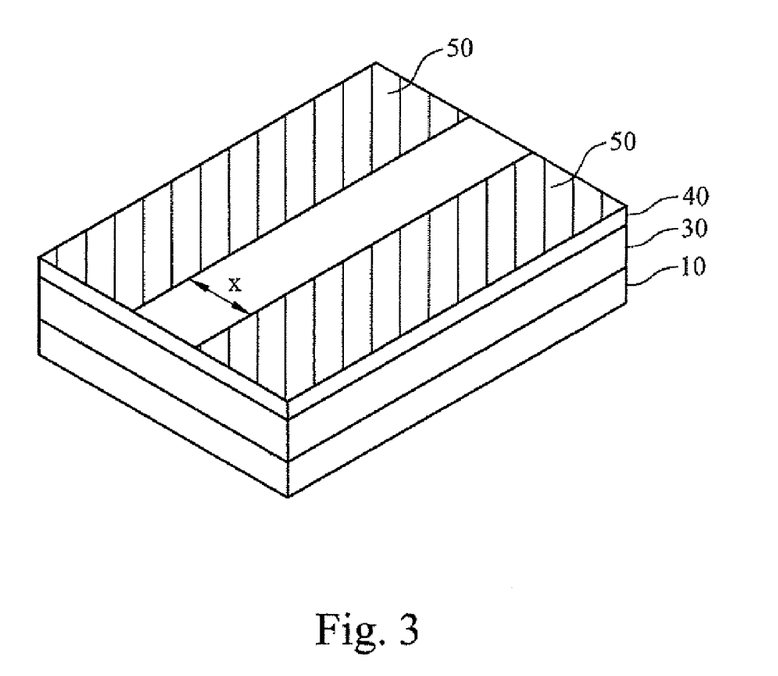
FIG. 3 is a perspective view of the structure of FIG. 2, with a first patterned layer of photoresist disposed thereon.

Referring to FIG. 3, a first one-dimensional photoresist pattern 50 can be produced on the top surface 42 of the second dielectric layer 40 using known photolithographic techniques. In the illustrated embodiment, this first one-dimensional photoresist pattern 50 may define the first dimension (i.e., the "X" or "Y" dimension) of a prospective contact hole 70 (FIGS. 5b, 5c) which will be formed using the inventive method. It will be appreciated that although the description refers to a contact hole, that the inventive method will be equally applicable to the formation of any holes or trenches in semiconductor materials for which right-angle corners are desired. Thus, for example, the method will find application in the formation of vias, trenches, general line ends, and the like.

After the first one-dimensional photoresist pattern 50 has been produced, its dimensions may be verified to ensure that a hole having the desired X-dimension will be produced during subsequent etching. This verification enables the user to compensate for any errors in line size/geometry introduced by the photolithographic pattern transfer process. Advantageously, where such errors are identified before etching is performed, appropriate corrections can be made either before or during the etching process.

In one embodiment, secondary emission microscopy (SEM) can be used to verify the X-dimension of the first one-dimensional photoresist pattern 50. Alternatively, transmission electron microscopy (TEM) can be used to verify the critical dimensions of the pattern. In a preferred embodiment, however, SEM will be used to enable in-line process monitoring, since TEM requires cutting the wafer.

Again, the results of the dimensional verification step are used to determine whether the desired pattern dimensions have been achieved. If the target pattern dimensions have been achieved, then etching can proceed without adjustment. If, however, the verification step reveals that the target pattern dimensions have not been achieved (i.e. signifying that the pattern is out of tolerance), then the subsequent etching process can be adjusted to compensate for the deviation. In one embodiment, dry etch plasma trimming can be employed to achieve the actual target dimension during the etching process. For example, if the after-develop-inspection target is 0.1 micron, but the actual measured value is 0.12 micron, the subsequent dry etch conditions can be adjusted to ensure that the actual etched layer dimension is within the 0.1 micron target value. Plasma trimming can consist of prolonging the etch process time, using a higher concentration of plasma gas, or using heavier atoms of plasma gas.

Figure 4:
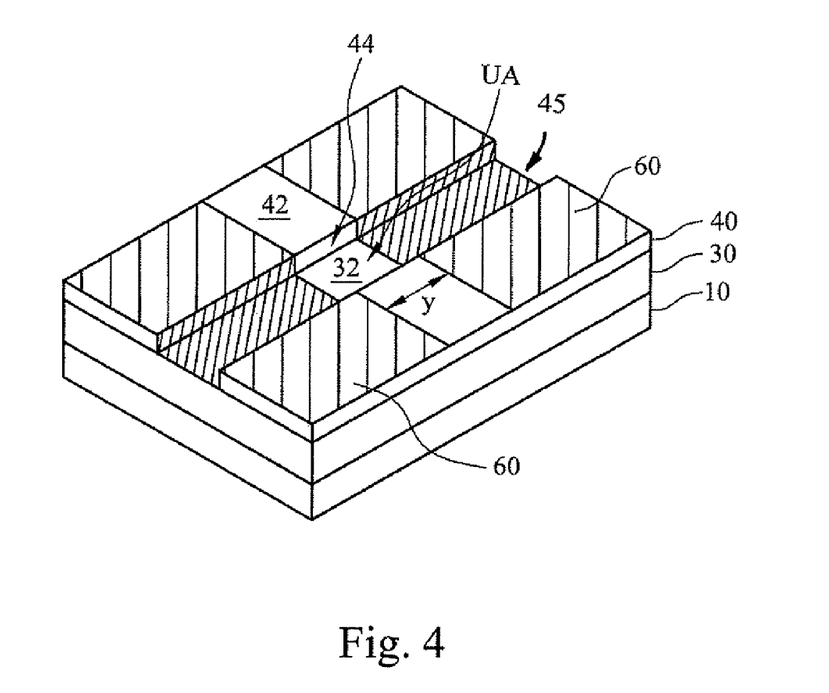
FIG. 4 is a perspective view of the structure of FIG. 3, after a first etching step, and with a second patterned layer of photoresist disposed thereon.

In one embodiment, the first etching step will utilize an anisotropic dry etching technique such as plasma etching using a carbon rich $C_xF_y$ plasma, such as $C_5F_8$, $C_4F_8$, or $C_4F_6$. The first etching step will proceed through the unprotected portions of the second dielectric layer 40 until the top surface 32 of the first dielectric layer 30 is reached, as illustrated in FIG. 4. Due to the appropriate selection of dielectric material for the first and second dielectric layers 30, 40 and the plasma used for the etch, the first dielectric layer 30 will act as an etch stop for this first etching step. The photoresist layer defining the first one-dimensional photoresist pattern 50 can then be removed, revealing a unidirectionally etched trench 45 in the second dielectric layer, as shown in FIG. 4.

Anisotropic plasma etching is preferred because it will produce substantially vertical sidewalls 44 in the etched material, thus allowing tight control over the width of the etching. Since the X-dimension of the first photoresist pattern 50 is verified prior to etching, the etched portion will have an X-dimension substantially equal to the target dimension.

Referring to FIG. 4, a second one-dimensional photoresist pattern 60 can be produced on the top surface 42 of the second dielectric layer 40. Like first one-dimensional pattern 50, second one-dimensional photoresist pattern 60 can be formed using known photolithographic techniques. This second photoresist pattern 60 will define a second dimension of the ultimate contact hole 70 (FIGS. 5b, 5c) (i.e. if the X-dimension was defined using the first one-dimensional pattern, the second one-dimensional pattern will define the Y-dimension, and vice versa). In the illustrated embodiment, the second one-dimensional photoresist pattern 60 defines the "Y" dimension of the contact hole 70.

As can be seen in FIG. 4, this new photoresist pattern 60 will cover portions of the top surface 32 of the first dielectric layer 30 that were unprotected during the first etch step. The overlapped unprotected area "UA" of the first dielectric layer 30 will define the desired geometry of the prospective contact hole 70 (FIGS. 5b, 5c), which will be etched through the first dielectric layer 30 during a second etching step. It is noted that the unprotected areas of the second dielectric layer 40, although not protected, will remain practically unaffected by this second etch step due to the large difference in etching rates between the layers and the appropriate selection of etch plasma chemical.

Once the second one-dimensional photoresist pattern 60 has been formed, the critical dimensions of the pattern can be verified using SEM or TEM in the manner previously described in relation to the first one-dimensional pattern 50. Once again, if the target dimensions for the second one-dimensional pattern 60 have not been achieved by the patterning step, then plasma trimming can be employed to adjust the etch to achieve the desired dimensioning during the etching step.

Figure 5A:
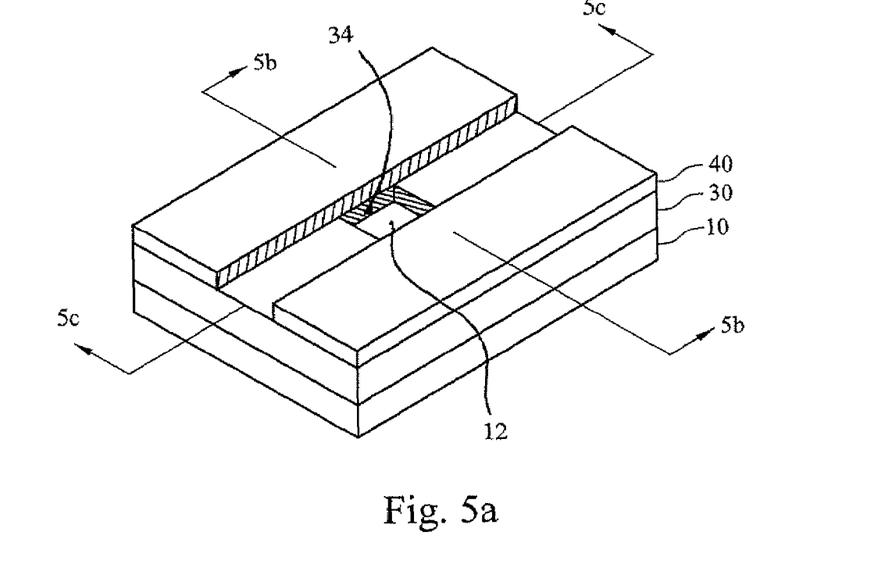
FIG. 5a is a perspective view of the structure of FIG. 4, after a second etching step, forming a hole in contact with a top surface of the substrate.

A second etching step may then performed to etch the unprotected area "UA" of the first dielectric layer 30 down to the surface 12 of the substrate 10, achieving the geometry illustrated in FIG. 5a. As with the first etch process, the second etch process will preferably be an anisotropic dry etching technique, thus producing an etched portion in the first dielectric layer having vertical sidewalls 34. In one embodiment, this second dry etch process will be a plasma etching process using a plasma such as $CF_4$, or $CHF_3$.

The etch selectivity between the first and second dielectric layers 30, 40 may be chosen so that the first etch results in removal of the unprotected portions of the second dielectric layer 40, but does not substantially etch the first dielectric layer 30 (that is, the first dielectric layer acts as an etch stop for the first etch process). Likewise, the etchant plasma for the second etch step may be selected so as to remove the unprotected portions of the first dielectric layer 30, but which does not substantially affect the second dielectric layer 40.

As noted, due to the preferential etching between first and second dielectric layers 30, 40, the second dielectric layer will remain largely unaffected by this second etch, and thus the portion of the first dielectric layer that underlies the second dielectric layer will be unaffected by the second etch step. As such, the second etch will proceed through the first dielectric layer 30 according to the precise X-Y bounding defined by the first etching step and the second one-dimensional pattern 60 to produce the final etched geometry illustrated in FIG. 5a.

Selection of the materials used for the first and second dielectric layers will preferably provide an etch selectivity of the first dielectric layer to the second dielectric layer of about 20. As will be appreciated, the etch selectivity (ratio) may be controlled through selection of the respective dielectric materials for the first and second layers 30, 40 as well as the chemicals used for the etch, although selectivity will primarily be determined by the choice of dielectric materials themselves.

As previously noted, the second dielectric layer 40 (300-500 Å) may also be substantially thinner than the first dielectric layer 30 (1000-2000 Å). One benefit of providing such a substantially thinner second dielectric layer 40 is that it may enhance surface coverage by the second one-dimensional photoresist pattern 60, which is required to cover not only a portion of the top surface 42 of the second dielectric layer 40, but also a portion of the trench 45 formed by the first etch step (see FIG. 4). The deeper the trench 45, the more difficult it may be to ensure adequate photoresist coverage of the surfaces within. This may be particularly true when the aspect ratio (i.e. trench height/trench width, or the thickness of the second dielectric layer divided by the dimension "X" of FIG. 3) of the prospective hole 70 (FIGS. 5b, 5c) is high. Thus, the thinner the second dielectric layer 40 is, the better the "gap-fill" performance of the second one-dimensional photoresist pattern 60 will be.

Furthermore, by-products (such as polymer) may be produced during the etch process, and these by-products may tend to deposit in the bottom of the trench or hole being etched, thus affecting the rate and efficiency of the etch. As a result, the amount of material etched near the bottom portion of the trench/hole may be less than that at the top portion. The resulting trench/hole may therefore be wider at the top than at the bottom, which will affect the verticality of the side surfaces 34, 44. By providing a relatively thin second dielectric layer 40, substantially vertical sidewalls 34, 44 (FIG. 4) may be achieved.

Figure 5B:
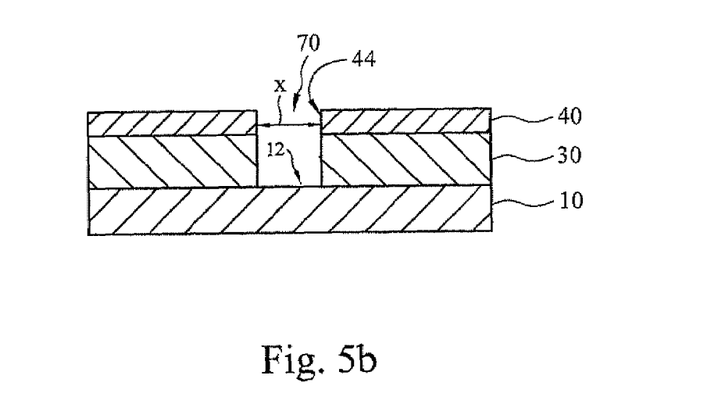
FIG. 5b is a cross section view of the structure of FIG. 5a, taken along line 5b-5b.
Figure 5C:
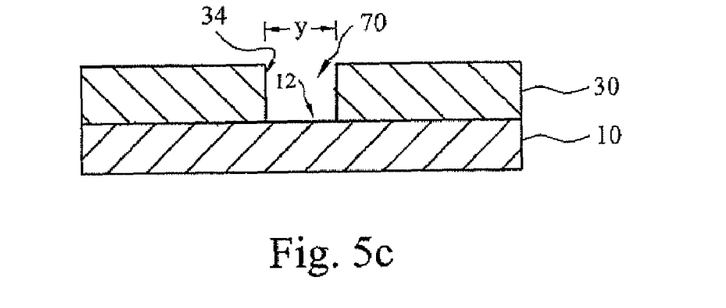
FIG. 5c is a cross section view of the structure of FIG. 5a, taken along line 5c-5c.

After the second etching step is completed, the second photoresist pattern 60 can be removed to provide the structure of FIGS. 5a-c. The resulting contact hole 70 will have the desired right-angle corners, vertical sidewalls 34, 44 and will also have the desired "X" and "Y" dimensions, owing to the sequential etching and verification steps previously described.

Figure 6:
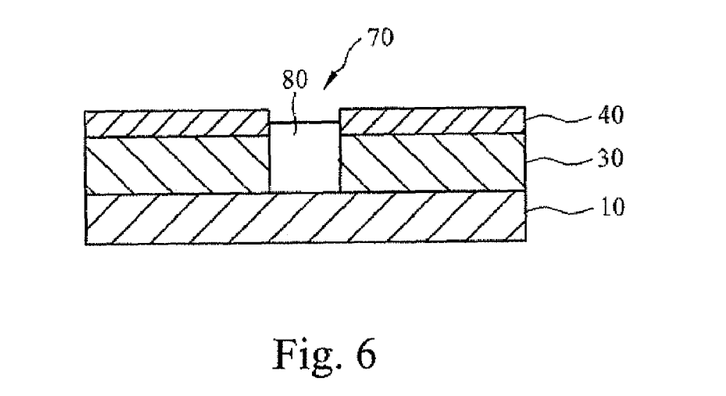
FIG. 6 is a cross section view of the structure of FIG. 5b, with a layer of metal deposited within the hole.
Figure 7:
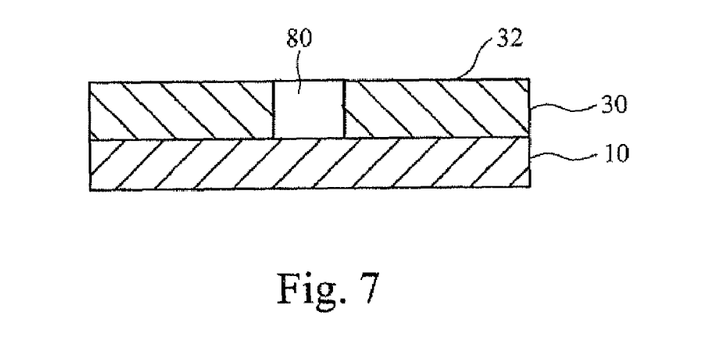
FIG. 7 is a cross section view of the structure of FIG. 6 after polishing has been performed to remove material down to the top surface of the first dielectric layer.

As shown in FIG. 6, the contact hole 70 can then be filled with a metal such as copper or copper alloy, using a metal deposition technique such as CVD or other appropriate process. The resulting surface may then be polished using a CMP process to remove the second dielectric layer 40 completely, along with any remaining metal, down to the top surface 32 of the first dielectric layer 30 (FIG. 7).

It will be appreciated that a substantial advantage is obtained with the present invention due to its discrete patterning, verification, and etching steps. By deconstructing the pattern into its discrete "X" and "Y" components, and verifying the dimensions of each component prior to etching, photolithographic mask transfer errors can be independently identified before etching, and can be corrected by precisely tuning the etch to result in a hole having the desired dimensional and geometric characteristics.

Additionally, since the patterns formed with the inventive method are either square or rectangular (as opposed to circular as can occur for lines that have been rounded or otherwise distorted during the photoresist pattern transfer process), the dimensional verification step will provide desired accurate results, thus assuring the user that the holes which are etched from those patterns will have the desired geometry and dimensions.

While the foregoing invention has been described with reference to the above embodiments, various modifications and changes can be made without departing from the spirit of the invention. Accordingly, all such modifications and changes are considered to be within the scope and range of equivalents of the appended claims.

The invention claimed is:

1. A method of forming a contact or via hole, comprising the steps of:
    (a) providing a substrate;
    (b) providing a first dielectric layer over the substrate;
    (c) providing a second dielectric layer over the first dielectric layer;
    (d) providing a first photoresist pattern over said second dielectric layer, said first photoresist pattern having a first dimension;
    (e) verifying the first dimension;
    (f) performing a first etch to remove a portion of the second dielectric layer left unprotected by the first photoresist pattern;
    (g) providing a second photoresist pattern over said second dielectric layer, said second photoresist pattern having a second dimension in a direction oriented substantially perpendicular to said first dimension;
    (h) verifying the second dimension;

(i) performing a second etch to remove a portion of the first dielectric layer left unprotected by the second photoresist pattern; wherein the second etch forms a hole in the first dielectric layer, said hole defined by said first and second dimensions of said first and second photoresist patterns;

(j) filling the hole with conductive material to a level above an upper surface of said first dielectric layer; and (k) removing the second dielectric layer and conductive material down to the upper surface of said first dielectric layer;

wherein the step of verifying the first dimension comprises measuring said first dimension and comparing a measured value of said first dimension to a reference value; and wherein the step of performing a first etch comprises adjusting the timing or chemical composition of the first etch to account for a difference between said measured value of said first dimension and said reference value.

2. The method of claim 1, wherein the step of verifying the second dimension comprises measuring said second dimension and comparing a measured value of said second dimension to a second reference value, and wherein said step of performing a second etch comprises adjusting the timing or chemical composition of the second etch to account for a difference between said measured value of said second dimension and said second reference value.

3. The method of claim 1, wherein said first and second etch steps comprise substantially anisotropic plasma etch processes.

4. The method of claim 1, wherein the first dielectric layer has a first etching rate and the second dielectric layer has a second etching rate that is substantially different from the first etching rate.

5. The method of claim 1, wherein said hole comprises a plurality of sidewalls that meet at substantially right-angles.

6. The method of claim 1, wherein said step of verifying said first dimension is performed using secondary emission microscopy (SEM).

7. A method of forming a hole in a semiconductor device, comprising the steps of:
(a) providing a substrate;
(b) depositing a first dielectric layer over said substrate;
(c) depositing a second dielectric layer over said first dielectric layer;
(d) providing a first patterned layer of photoresist over said second dielectric layer, said first patterned layer of photoresist defining a first dimension;
(e) measuring said first dimension and comparing a measured value of said first dimension with a first reference dimension;
(f) performing a first etch step to form a substantially planar first sidewall in said second dielectric layer, and to expose a portion of said first dielectric layer;
(g) providing a second patterned layer of photoresist over said second dielectric layer and over said exposed portion of said first dielectric layer, said second patterned layer of photoresist defining a second dimension;
(h) measuring said second dimension and comparing a measured value of said second dimension with a second reference dimension;
(i) performing a second etch step to remove a portion of said first dielectric layer left unprotected by second patterned layer of photoresist; wherein the second etch step forms a hole in the first dielectric layer, said hole being defined by said first and second dimensions of said first and second patterned layer of photoresist;
(j) filling the hole with conductive material to a level above an upper surface of said first dielectric layer; and
(k) removing the second dielectric layer and conductive material down to the upper surface of said first dielectric layer;

wherein the step of performing a first etch comprises adjusting the timing or chemical composition of the first etch to account for a difference between said measured value of said first dimension and said first reference dimension.

8. The method of claim 7, wherein the first and second etch steps comprise substantially anisotropic plasma etch processes, and wherein the plasma compound used for the first etch step is substantially different from the plasma compound used for the second etch step.

9. The method of claim 7, wherein an etch selectivity of said first dielectric layer to said second dielectric layers is at least about twenty.

10. The method of claim 7, wherein said hole is defined by a plurality of sidewalls, with adjacent sidewalls meeting at substantially perpendicular angles.

11. The method of claim 7, wherein said step of measuring said first dimension is performed using SEM.

12. The method of claim 7, wherein said first and second etch steps comprise substantially anisotropic dry etch processes.

13. The method of claim 7, wherein said step of performing a second etch comprises adjusting the timing or chemical composition of the second etch if there is a substantial difference between said measured value of said second dimension and said second reference dimension.

14. A method of forming a hole in a semiconductor device, comprising the steps of:
(a) providing a substrate;
(b) providing a first dielectric layer over said substrate;
(c) providing a second dielectric layer over said first dielectric layer;
(d) providing a first patterned layer of photoresist over said second dielectric layer;
(e) measuring a first dimension of said first patterned layer of photoresist and comparing said first dimension to a first reference value;
(f) performing a first substantially anisotropic dry etch to form a first sidewall in the second dielectric layer;
(g) stripping the first patterned layer of photoresist;
(h) providing a second patterned layer of photoresist over the second dielectric layer and over an exposed portion of the first dielectric layer;
(i) measuring a second dimension of said second patterned layer of photoresist and comparing said second dimension to a second reference value;
(j) performing a second substantially anisotropic dry etch to remove a portion of the first dielectric layer left unprotected by the second patterned layer of photoresist; wherein said second substantially anisotropic dry etch forms a hole in said first dielectric layer, said hole being defined by said first and second dimensions of said first and second patterned layer of photoresist;
(j) filling the hole with conductive material to a level above an upper surface of said first dielectric layer; and
(k) removing the second dielectric layer and conductive material down to the upper surface of said first dielectric layer;

wherein said step of performing a first substantially anisotropic dry etch comprises adjusting the timing or chemical composition of the first substantially anisotropic dry etch if there is a substantial difference between said first dimension and said first reference value.

15. The method of claim 14, wherein said step of performing a first substantially anisotropic dry etch comprises adjusting the timing or chemical composition of the second substantially anisotropic dry etch if there is a substantial difference between said second dimension and said second reference value.

16. The method of claim 15, wherein said hole is defined by a plurality of sidewalls, with adjacent sidewalls meeting at substantially perpendicular angles.

17. The method of claim 16, wherein said step of measuring said first dimension is performed using SEM.

18. The method of claim 17, wherein said first and second etch steps comprise substantially anisotropic dry etch processes.

* * * * *